(12) United States Patent
Liou et al.

(10) Patent No.: US 9,760,112 B2
(45) Date of Patent: Sep. 12, 2017

(54) APPARATUS FOR COMMUNICATING ANOTHER DEVICE

(71) Applicant: MEDIATEK INC., Hsin-Chu (TW)

(72) Inventors: Ming-Luen Liou, Taipei (TW); Rong-Liang Chiou, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 187 days.

(21) Appl. No.: 14/791,263

(22) Filed: Jul. 3, 2015

(65) Prior Publication Data
US 2015/0301556 A1 Oct. 22, 2015

Related U.S. Application Data

(62) Division of application No. 13/349,538, filed on Jan. 12, 2012, now Pat. No. 9,106,329.

(60) Provisional application No. 61/438,246, filed on Jan. 31, 2011.

(51) Int. Cl.
| | |
|---|---|
| *G06F 1/04* | (2006.01) |
| *H03K 17/16* | (2006.01) |
| *H03K 19/003* | (2006.01) |
| *H04B 15/02* | (2006.01) |

(Continued)

(52) U.S. Cl.
CPC .............. *G06F 1/04* (2013.01); *H03K 17/16* (2013.01); *H03K 19/00346* (2013.01); *H04B 15/02* (2013.01); *G06F 1/06* (2013.01); *G06F 13/4086* (2013.01)

(58) Field of Classification Search
USPC .................. 713/500; 327/379; 326/21, 30
See application file for complete search history.

(56) References Cited

U.S. PATENT DOCUMENTS

| 4,583,013 A | * | 4/1986 | Gupta | ..................... H03K 5/19 326/101 |
|---|---|---|---|---|
| 5,111,080 A | | 5/1992 | Mizukami | |
| 5,264,744 A | | 11/1993 | Mizukami | |

(Continued)

FOREIGN PATENT DOCUMENTS

| CN | 1339199 A | 3/2002 |
|---|---|---|
| CN | 101023580 A | 8/2007 |

(Continued)

OTHER PUBLICATIONS

"International Search Report" dated May 10, 2012 for International application No. PCT/CN2012/070790, International filing date:Jan. 31, 2012.

*Primary Examiner* — Ji H Bae
(74) *Attorney, Agent, or Firm* — Winston Hsu

(57) ABSTRACT

A semiconductor chip comprising: an internal clock circuit for generating an internal clock signal; a first phase shift device for shifting the phase of an external clock signal and outputting a phase shifting clock signal; a multiplexer, for selectively outputting one of the internal clock signal and the phase shifting clock signal to be a first clock signal; a second phase shift device, for shifting the phase of the first clock signal and outputting a second clock signal; an first output pad, for outputting the first clock signal; and a controllable pad. The controllable pad is controlled to selectively act as an input pad for receiving the external signal and transmitting the external clock signal to the first phase shift device, or act as a second output pad for transmitting the second clock signal.

10 Claims, 6 Drawing Sheets

(51) Int. Cl.
*G06F 13/40* (2006.01)
*G06F 1/06* (2006.01)

(56) References Cited

U.S. PATENT DOCUMENTS

| | | | |
|---|---|---|---|
| 6,745,046 | B1 | 6/2004 | Eckert |
| 7,533,311 | B2 * | 5/2009 | Tran .................. G06F 13/4027 370/366 |
| 8,072,242 | B2 | 12/2011 | Barbier |
| 9,065,460 | B1 * | 6/2015 | Carnu ....................... G06F 1/04 |
| 2005/0007717 | A1 | 1/2005 | Chuang |
| 2006/0290375 | A1 | 12/2006 | Kao |
| 2006/0290376 | A1 | 12/2006 | Kao |
| 2007/0252644 | A1 | 11/2007 | Ohama |
| 2007/0273410 | A1 | 11/2007 | Miike |
| 2010/0257293 | A1 | 10/2010 | Xia |

FOREIGN PATENT DOCUMENTS

| | | |
|---|---|---|
| CN | 101079625 A | 11/2007 |
| CN | 101217468 A | 7/2008 |
| EP | 2 237 500 A1 | 10/2010 |

* cited by examiner

US 9,760,112 B2

APPARATUS FOR COMMUNICATING ANOTHER DEVICE

CROSS REFERENCE TO RELATED APPLICATION

This application claim is a division of applicant's earlier application, Ser. No. 13/349,538, filed 2012 Jan. 12, which claims the benefit of U.S. Provisional Application No. 61/438,246, filed on 2011 Jan. 31 and entitled "APPARATUS FOR COMMUNICATING ANOTHER DEVICE". The above-mentioned applications are included in their entirety herein by reference.

BACKGROUND

The present application relates to an apparatus for communicating another device, and particularly relates to an apparatus having EMI protection mechanism.

EMI (Electromagnetic Interference) is a common problem that can be found in almost every electronic apparatus. EMI is a disturbance that affects an electrical circuit due to either electromagnetic induction or electromagnetic radiation emitted from an external source. The disturbance may interrupt, obstruct, or otherwise degrade or limit the effective performance of the circuit. The EMI source may be any object, artificial or natural, that carries rapidly changing electrical currents, such as an electrical circuit, the Sun or the Northern Lights.

FIG. 1 is a block diagram illustrating an example of how EMI issue occurs. As shown in FIG. 1, chip 101 transmits or receives data or clock signal to and from the chip 103. The chip 101 and the chip 103 may respectively couple to antennas 102, 104 for receiving respective RF signals. Resistance circuits 105 (only one of them is symbolized) which may include resistor, inductance devices or capacitors are placed on a printed circuit board (PCB), and connect the chips 101 and 103 through traces. A die 107 is encapsulated in the chip 101. The die 107 includes a plurality of bounding pads. The bonding pads of the die 107 are electrically connected to input/output pins 109, 111, 113 through bonding wires 115, 117, 119.

As the electronic devices shown in FIG. 1, the signals transmitted in regions A, B and E may suffer EMI effect caused by the signals transmitted in regions C and D. Many solutions are developed to solve the EMI problem. For example, adding a balun or a saw filter to the region A, or adding a shielding to surround the chip would be favorable. Alternatively, optimizing RF architecture, antenna layout, bounding wire length or signal transmitting waveform can be helpful on reducing EMI effect. However, these methods need either extra hardware cost or complex design.

SUMMARY

One embodiment of the present application discloses a semiconductor chip comprising: an internal clock circuit for generating an internal clock signal; a first phase shift device for shifting the phase of an external clock signal and outputting a phase shifting clock signal; a multiplexer, coupled to the internal clock circuit and the first phase shift device, for selectively outputting one of the internal clock signal and the phase shifting clock signal to be a first clock signal; a second phase shift device, coupled to the multiplexer, for shifting the phase of the first clock signal and outputting a second clock signal; an first output pad, coupled to the multiplexer for outputting the first clock signal; and a controllable pad, coupled to the first phase shift device and the second phase shift device. The controllable pad is controlled to selectively act as an input pad for receiving the external signal and transmitting the external clock signal to the first phase shift device, or act as a second output pad for transmitting the second clock signal.

Another embodiment of the present application discloses a semiconductor chip comprising: an internal clock circuit for generating an internal clock signal; a first phase shift device for shifting the phase of the internal clock signal and outputting a phase shifting clock signal; a multiplexer, coupled to the first phase shift device, for selectively outputting one of an external clock signal and the phase shifting clock signal to be a first clock signal; a second phase shift device, coupled to the multiplexer, for shifting the phase of the first clock signal and outputting a second clock signal; a first output pad, coupled to the second phase shift device for outputting the second clock signal; and a controllable pad, coupled to the multiplexer. The controllable pad is controlled to selectively act as an input pad for receiving the external signal, or act as a second output pad for transmitting the first clock signal.

Another embodiment of the present application discloses a method of generating a pair of differential clock signals, wherein the pair of differential clock signals comprises a positive clock signal and a negative clock signal. The method comprising: providing a first clock signal; generating a phase shifting clock signal by shifting the phase of a second clock signal; selectively outputting one of the first clock signal and the phase shifting clock signal to be the positive clock signal; generating the negative clock signal by shifting the phase of the positive clock signal; outputting the positive clock signal; and controlling a controllable pad to selectively act as an input pad for receiving the second clock signal, or act as an output pad for transmitting the negative clock signal.

Another embodiment of the present application discloses a method of generating a pair of differential clock signals, wherein the pair of differential clock signals comprises a positive clock signal and a negative clock signal. The method comprises: providing a first clock signal; generating a phase shifting clock signal by shifting the phase of a second clock signal; selectively outputting one of the first clock signal and the phase shifting clock signal to be the positive clock signal; generating the negative clock signal by shifting the phase of the positive clock signal; outputting the negative clock signal; and controlling a controllable pad to selectively act as an input pad for receiving the first clock signal, or act as an output pad for transmitting the positive clock signal.

Another embodiment of the present application discloses a semiconductor chip which is capable of mounting on a printed circuit board, comprising: a signal generating circuit for generating a first signal and a second signal; a first output node for transmitting the first signal; and a second node comprising a controllable pad selectively acts as output for transmitting the second signal, or acts as input for receiving an external signal; wherein the second node is utilized for connecting a terminator device mounted on the printed circuit board when the second node acts as the output, and a phase of the second signal is opposite to that of the first signal, wherein the second node receives the external signal when the second node acts as the input, and a phase of the external signal is opposite to that of the first signal.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, some other person may refer a component to different names. This document does not intend to distinguish between components that differ in name but not function. In the following description and in the claims, the terms "include" and "comprise" are used in an open-ended fashion, and thus should be interpreted to mean "include, but not limited to . . . " Also, the term "couple" is intended to mean either an indirect or direct electrical connection. Accordingly, if one device is coupled to another device, that connection may be through a direct electrical connection, or through an indirect electrical connection via other devices and connections.

Figure 1:
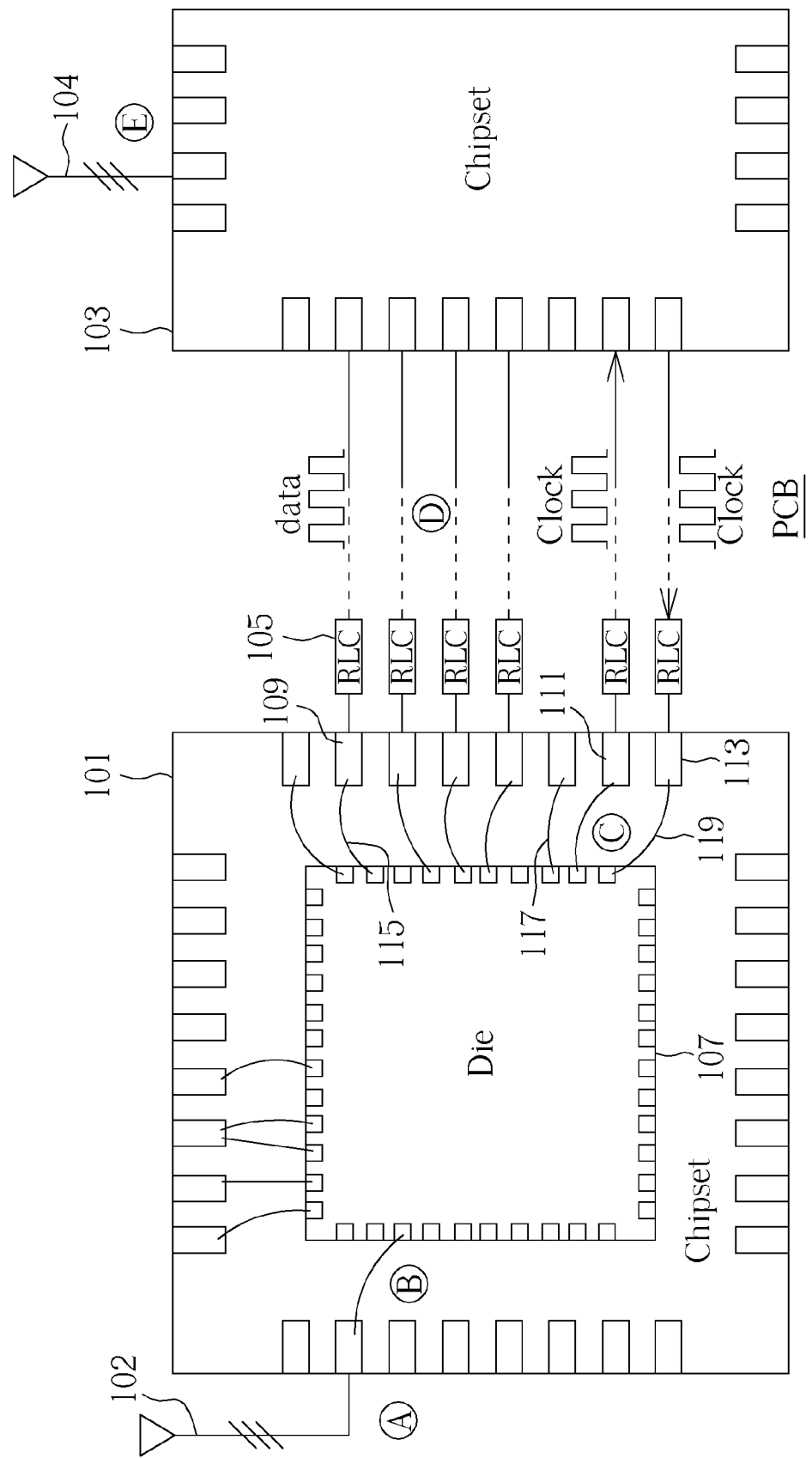
FIG. 1 is a block diagram illustrating an example of how EMI issue occurs.
Figure 2:
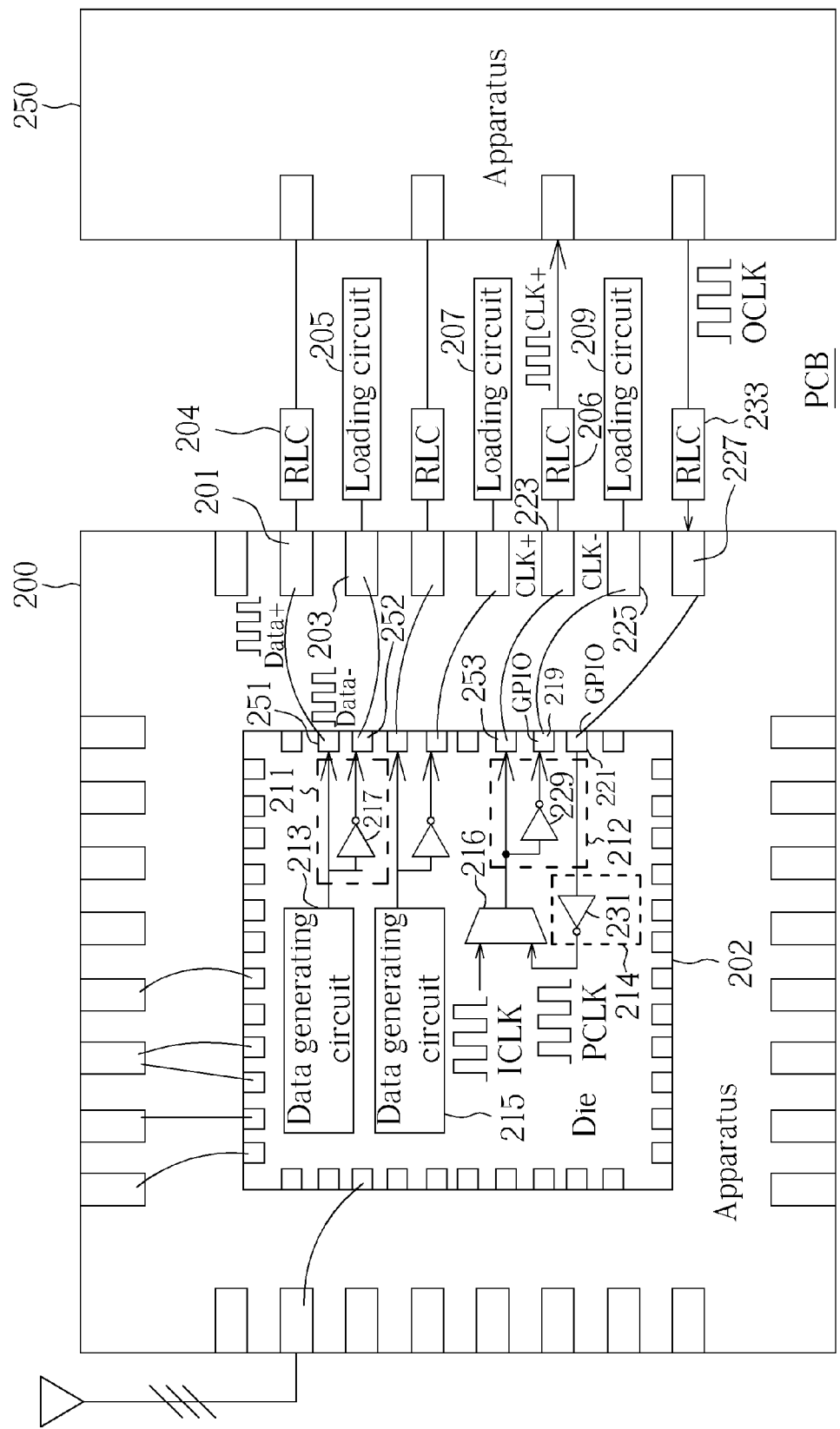
FIG. 2 is a block diagram illustrating an apparatus 200 connecting with an apparatus 250 with EMI protection/reduction mechanism or circuit according to one embodiment of the present application.

FIG. 2 is a block diagram illustrating an apparatus 200 connecting with an apparatus 250 with EMI protection/reduction mechanism or circuit according to one embodiment of the present application. The apparatus 200 and the apparatus 250 can be well packaged chipsets but are not limited, either of them can be any other kind of electronic devices. As shown in FIG. 2, the apparatus 200 includes a die 202 and a package carrier, e.g. IC carrier, IC substrate or leadframe. The die 202 is places on the package carrier. The die 202 and the package carrier may both encapsulated by encapsulation material. In this embodiment, the die 202 includes a differential signal generating circuit 211, data generating circuits 213, 215 (e.g. an internal circuit in the die 202), and a plurality of input/output bonding pads. The input/output bonding pads include data output pads 251, 252, clock output pads 253, 219, and/or clock receiving pad 221. The data output pads 251, 252 connect to pins 201, 203 (only two of them are symbolized) of the package carrier through bonding wires or traces of the package carrier. The clock output pads 253, 219 connect to pins 223, 225 of the package carrier through bonding wires or traces of the package carrier. The clock receiving pad 221 connect to pin 227 of the package carrier through bonding wire or trace of the package carrier.

A plurality of loading circuits 205, 207, 209 are shown in FIG. 2. Each of the loading circuits may include resistor, capacitor, inductor or the combination of them or other electronics devices. Each of the loading circuit is coupled between one pin of the package carrier of apparatus 200 and a ground potential to act as a terminator. The loading circuit is capable of being disposed inside or outside of the apparatus 200. In other word, the loading circuit is capable of being placed inside of the die 202 as a portion of an inside circuit of the die 202. Or, the loading circuit is capable of being placed on the package carrier connected to the bonding pad and the pin of the package carrier. FIG. 2 also shows a plurality of resistance circuits 204, 206, 233 which may include resistor, inductance device, or capacitor are placed on the PCB. The resistance circuits 204, 206, 233 connect the apparatuses 200 and 250 through traces on the PCB.

The data generating circuits 213, 215 serve to generate data signals. For the sake of brevity, only one data generating circuit 213 is utilized to explain the operation for the embodiment of the present application here. The differential signal generating circuit 211 receives the data signal generated from the data generating circuits 213, and outputs a pair of differential data signal. The pair of differential data signal include a positive data signal Data+ and a negative data signal Data−. The pair of differential data signal Data+, Data− are respectively outputted to the pins 201 and 203 through the data output pads 251, 252 and bonding wires there between. The pin 201 may connect to the apparatus 250 through trace on the PCB, or in addition couple to the apparatus 250 through a resistance circuit 204. The pin 203 may connect to a voltage potential (e.g. ground) of the PCB through a trace, or in addition couple to the ground potential through the loading circuits 205.

In this embodiment, the differential signal generating circuit 211 outputs the data signal to be the positive data signal Data+. Also, the differential signal generating circuit 211 includes an inverter 217 for inverting the data signal or the positive data signal Data+ to generate the negative data signal Data−. Alternatively, the differential signal generating circuit 211 includes a delay component (not shown in FIG. 2) for delaying the data signal and output the positive data signal Data+ so as to compensate the delayed time of the negative data signal Data− introduced by the inverter 217. Accordingly, the negative data signal Data− has opposite phase with which of the positive data signal Data+.

In view of above mentioned embodiments, the EMI noises caused by the positive data signal Data+ and the negative data signal Data− respectively can be neutralized, since the positive data signal Data+ and the negative data signal Data− introducing similar amount of EMI noise, which have opposite phases to each other. By this way, EMI effect to the data signal can be eliminated, reduced or avoided.

Similar EMI protection/reduction mechanism shown in above can be applied to clock signals, which is explained as follows. In this embodiment, the clock signals can be classified into two groups in terms of the generating source. The first group includes an internal clock signal ICLK which is generated by clock circuit (not shown) inside of the apparatus 200. The second group includes an external clock signal OCLK which is transmitted from outside of the apparatus 200, e.g. transmitted from apparatus 250.

The clock receiving pad 221 of the die 202 receives the external clock signal OCLK through the pin 227 and bonding wire. The die 202 further includes a differential signal generating circuit 212, a phase shifting circuit 214, and a multiplexer 216. The phase shifting circuit 214 includes an inverter 231. The inverter 231 receives the external clock signal OCLK, and inverts the phase of the external clock signal OCLK so as to generate a phase shifting clock signal PCLK. The multiplexer 216 is able to be controlled by a controller (not shown) for selectively outputting one of the internal clock ICLK or the phase shifting clock signal PCLK as a positive clock signal CLK+. The differential signal generating circuit 212 receives the positive clock signal CLK+, and outputs a pair of differential clock signal, including the positive clock signal CLK+, and a negative clock signal CLK−. The pair of differential clock signal CLK+, CLK− are respectively outputted to the pins 223 and 225 through the clock output pads 253, 219 and bonding wires. The pin 223 may connect to the apparatus 250 through trace on the PCB, or in addition couple to the apparatus 250 through a resistance circuit 206. The pin 225 may connect to a voltage potential (e.g. ground) of the PCB through a trace, or in addition couple to the ground potential through the loading circuits 209.

In this embodiment, the differential signal generating circuit 212 outputs the positive clock signal CLK+ to the clock output pads 253. Also, the differential signal generating circuit 212 includes an inverter 229 for inverting the positive clock signal CLK+ to generate the negative clock signal CLK−. Alternatively, the differential signal generating circuit 212 includes a delay component (not shown in FIG. 2) for delaying the positive clock signal CLK+ so as to compensate the delayed time of the negative clock signal CLK− introduced by the inverter 229. Accordingly, the negative clock signal CLK− has opposite phase with which of the positive clock signal CLK+.

In this embodiment, by controlling the multiplexer 216, the apparatus 200 is able to operate in different clock modes, i.e. internal clock mode and external clock mode. In the internal clock mode, as shown in FIG. 2, the multiplexer 216 is controlled to output the internal clock ICLK. Also, the clock output pad 219 may be a controllable pad (ex. a general purpose input/output Pad; GPIO PAD) which is controlled to be active or enabled by the controller. And the clock receiving pad 221 for receiving the external clock signal OCLK may be a controllable pad (ex. GPIO PAD) which is controlled to be inactive or disabled by the controller.

In the external clock mode, the apparatus 200 receives the external clock OCLK via a clock receiving pad 221 through pin 227. The phase shifting circuit 214 receives the external clock signal OCLK and generates a phase shifting clock signal PCLK, which has the same frequency of which of the external clock signal OCLK but with inverse phases with which of the external clock signal OCLK. In the external clock mode, the multiplexer 216 is controlled by the controller to output the phase shifting clock signal PCLK rather than to output the internal clock signal ICLK in the internal clock mode. Besides, the clock receiving pad 221 (e.g. GPIO PAD) is controlled to be active or enabled by the controller to be an input pad. And the clock output pad 219 (e.g. GPIO PAD) is controlled to be inactive or disabled by the controller. Accordingly, the phase shifting clock signal PCLK is outputted as the positive clock signal (CLK+) via the pin 223 through clock output pad 253 and bonding wire but no clock signal is outputted to the pin 225. In one embodiment, the phase shifting clock signal PCLK has an opposite phase with which of the external clock OCLK.

Similar with the EMI protection/reduction mechanism of the data signal, the EMI noises introduced by the positive clock signal CLK+ and the negative clock signal CLK− can be neutralized, since they have opposite phases.

In one embodiment, the apparatus 200 and the apparatus 250 can be implemented in a communication device. For example, the apparatus 200 may be a TV module and the apparatus 250 may be a mobile phone module. Please note that the apparatuses with EMI protection/reduction mechanism according to the present application can be applied to any other devices besides the communication device.

Figure 3A:
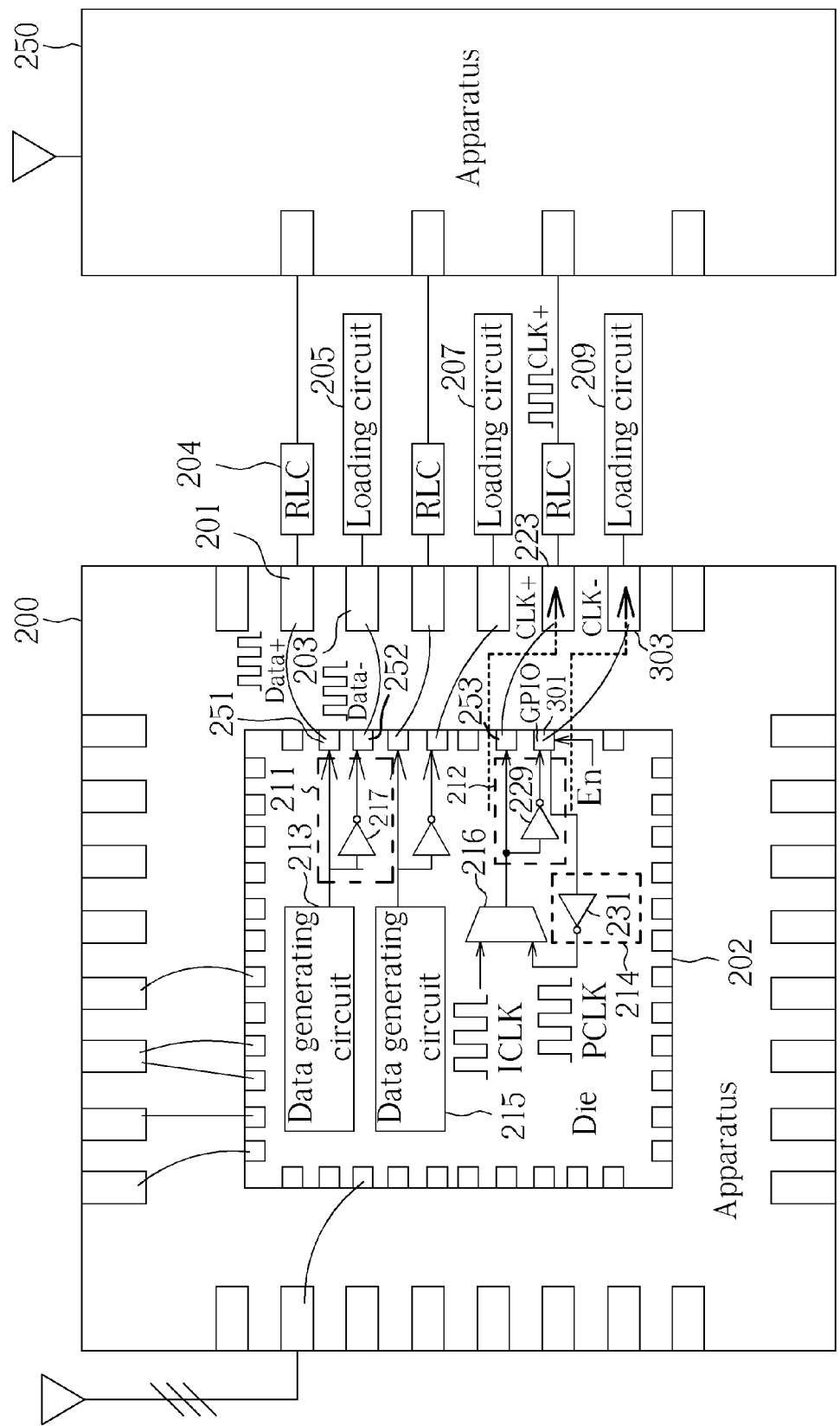
FIGS. 3A and 3B are block diagrams illustrating apparatuses with EMI protection/reduction mechanism according to another embodiment of the present application.
Figure 3B:
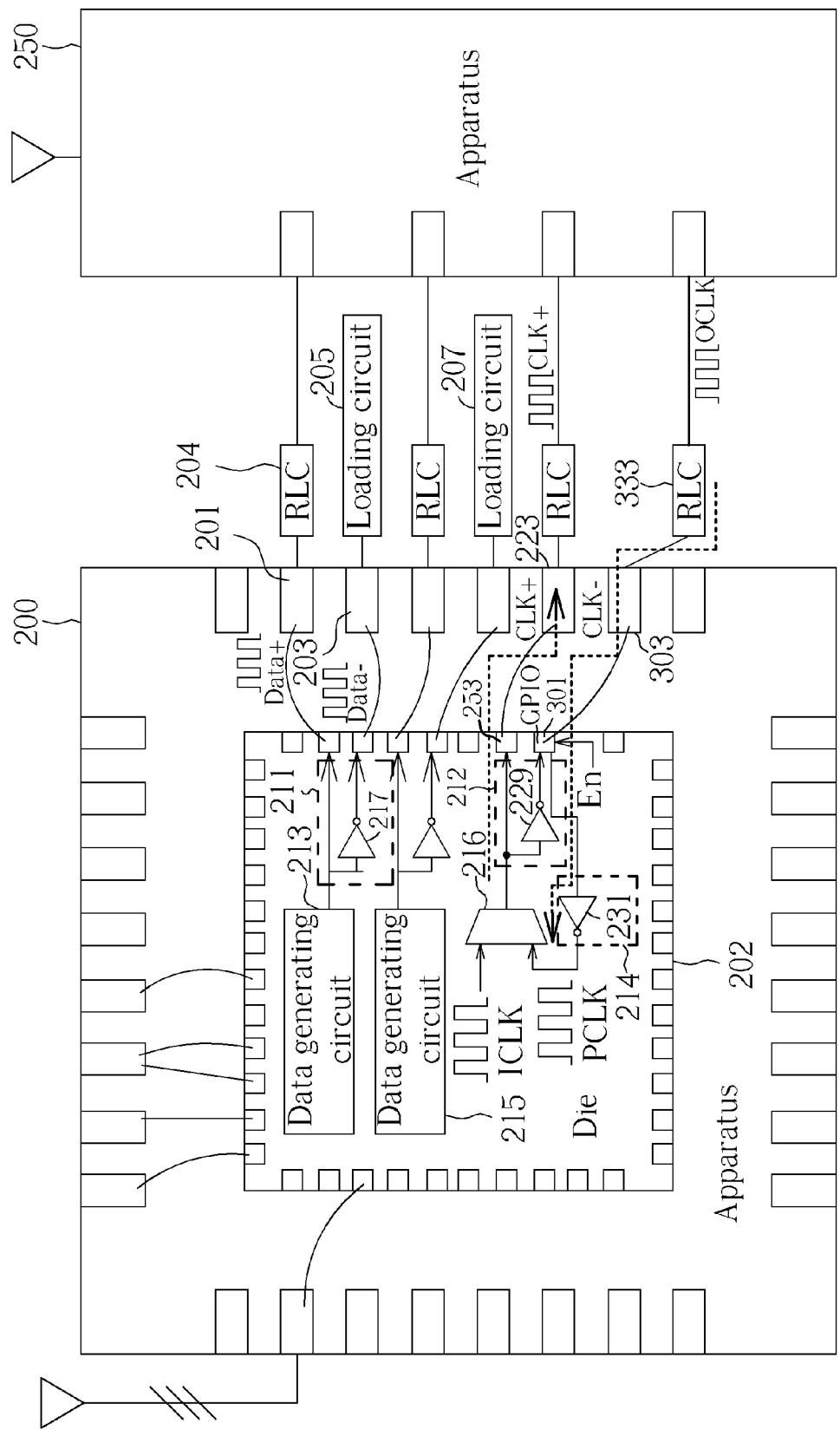

FIGS. 3A and 3B are block diagrams illustrating apparatuses with EMI protection/reduction mechanism according to another embodiment of the present application. The difference between the embodiments in FIG. 2 and FIG. 3 is that the two controllable pads 219 and 221 in FIG. 2 are changed to be a single controllable pad 301 in FIG. 3 for performing the similar functions. Also, single controllable pad 301 connects to pin 303 through bonding wire. By doing so, the pad numbers and pin counts can be decreased. The operation of the embodiments shown in FIGS. 3A and 3B are respectively described as follows.

FIG. 3A is a block diagram illustrating an apparatus with EMI protection/reduction mechanism in an internal clock mode, according to one embodiment of the present application. In this embodiment, in an internal clock mode, the controllable pad 301 is controlled by an enable signal EN issued from the controller, so that the controllable pad 301 acts as an output pad. Thus, the pin 303 connects to a ground potential of the PCB through a trace, in addition couples to the ground potential through the loading circuits 209. Also, the multiplexer 216 is controlled to output the internal clock signal ICLK. Such that the differential signal generating circuit 212 outputs the internal clock ICLK as the positive clock signal CLK+. And the differential signal generating circuit 212 inverts the internal clock ICLK by the inverter 229 to generate the negative clock signal CLK−. The signal transmitting paths in FIG. 3A are marked by dotted lines.

FIG. 3B is a block diagram illustrating an apparatus with EMI protection/reduction mechanism in an external clock mode, according to one embodiment of the present application. In this embodiment, in an external clock mode, the controllable pad 301 is controlled by the enable signal EN issued from the controller, so that the controllable pad 301 acts as an input pad. Thus, the pin 303 connects to the apparatus 250 to receive the external clock signal OCLK through a trace, in addition couples to the apparatus 250 through a resistance circuits 333. Also, the multiplexer 216 is controlled to output the phase shifting clock signal PCLK. The signal transmitting paths in FIG. 3B are also marked by dotted lines. The differential signal generating circuit 212 outputs the positive clock signal CLK+ to the clock output pad 253. Thus the positive clock signal CLK+ has an opposite phase to which of the external clock signal. In context, the external clock signal OCLK and the positive signal CLK+ can be considered as a pair of differential clock signal so as to eliminate or reduce the EMI effect. It is well known by the person skill in the art, although, the controllable pad 301 (e.g. GPIO PAD) may receive an inverted signal from the inverter 229 and the external clock signal OCLK. The received external clock signal OCLK does not affect by the inverted signal, since the pad 301 has been controlled to be the input pad.

Figure 4B:
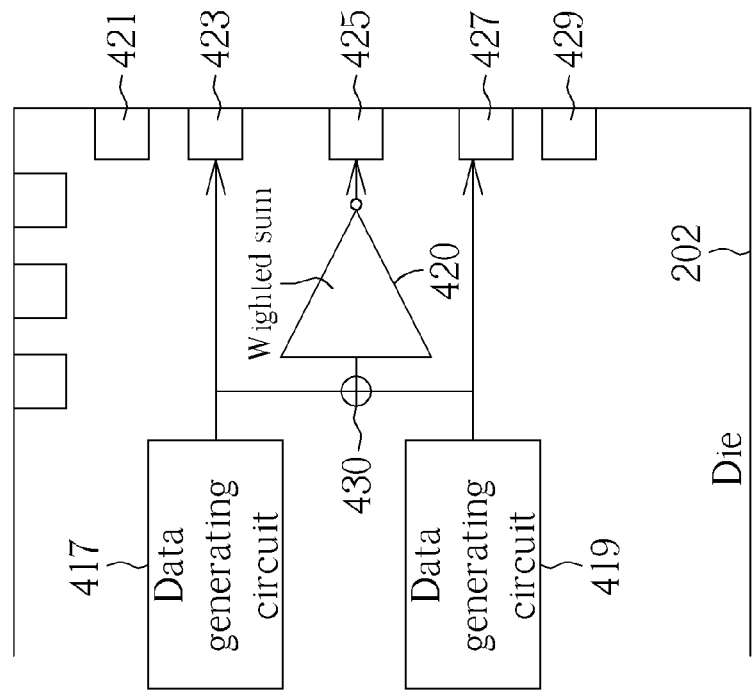
FIG. 4B is a block diagram illustrating a portion of circuits of the apparatus with EMI protection/reduction mechanism according to another embodiment of the present application.
Figure 4A:
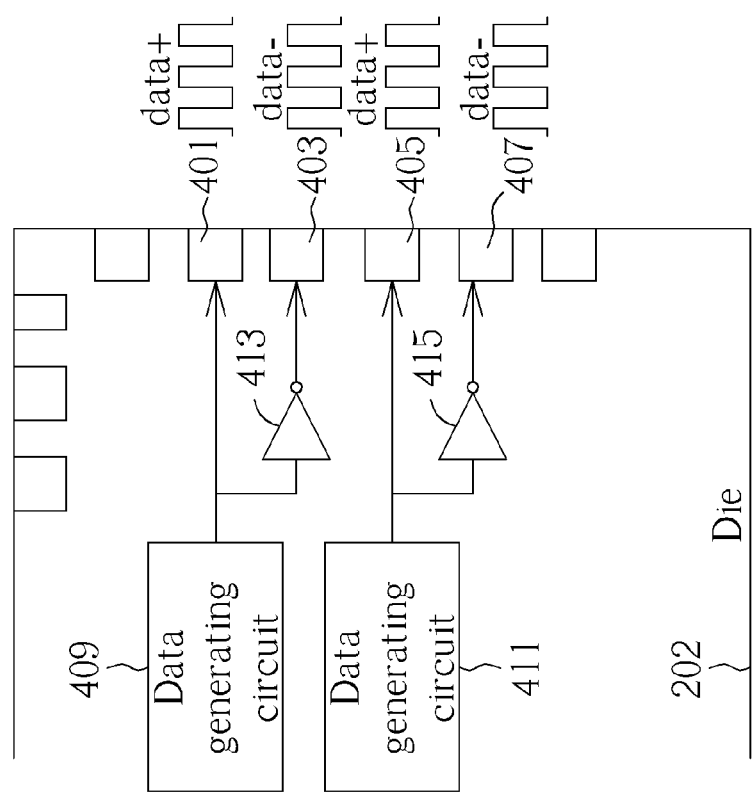
FIG. 4A is a block diagram illustrating a portion of the circuits shown in FIG. 3.

FIG. 4A is a block diagram illustrating a portion of the circuits shown in FIG. 3. FIG. 4B is a block diagram illustrating a portion of circuits of the apparatus with EMI protection/reduction mechanism according to another embodiment of the present application. As shown in FIG. 4A, the signal generating circuits 409 is coupled to the inverter 413 and pads 401/403 for transmitting a first positive signal and a first negative signal. Also, the signal generating circuits 411 is coupled to the inverter 415 and pads 405/407 for transmitting a second positive signal and a second negative signal. However, in FIG. 4B, signal generating circuits 417, 419 are designed to be able to share an inverter module 420 to generate the inverse signal. The signal generating circuit in this embodiment could be a data signal generating circuit, clock signal generating circuit, control signal generating circuit and any other electronic signals' generating circuit. In FIG. 4B, the inverter module 420 may include an adder 430 and an inverter. The adder adds the first positive signal and the second positive signal to generate a sum signal. The inverter inverses the sum signal to generate a hybrid signal so as to reduce the EMI noise introduced by both the first positive signal and the second positive signal.

In another embodiment, in FIG. 4B, the inverter module 420 may include a weighted sum circuit controlled by the controller (not shown). The weighted sum circuit is able to provide various weightings for summing up the first positive signal and the second positive signal, respectively, so as to generate various weighted sum signal. In one embodiment, the weightings are equal. In another embodiment, the weighted sum circuit 420 is controlled to serve weightings of 0 and 1 for summing up the first positive signal and the second positive signal respectively, so as to favor one of the first positive signal and the second positive signal. Further, the weighted sum circuit 420 is controlled to periodically switching weightings of 0 and 1 between the first positive signal and the second positive signal so as to generate an inverted first positive signal and an inverted second positive signal in a time-sharing manner. By this way, the circuit area, the pad numbers and pin counts of the die 202 can be decreased. The pad 425 can output a hybrid signal mixed with the inverted signals generated from the signal generating circuits 417 and 419, and EMI protection/reduction with different efficiency can be performed. Although, in the embodiment of FIG. 4B, two signals are mixed together for generating the inverted signal so as to reduce the EMI effect, the artisan is able to design a circuit for mixing more than two signals for reducing the EMI effect thereof.

Figure 5:
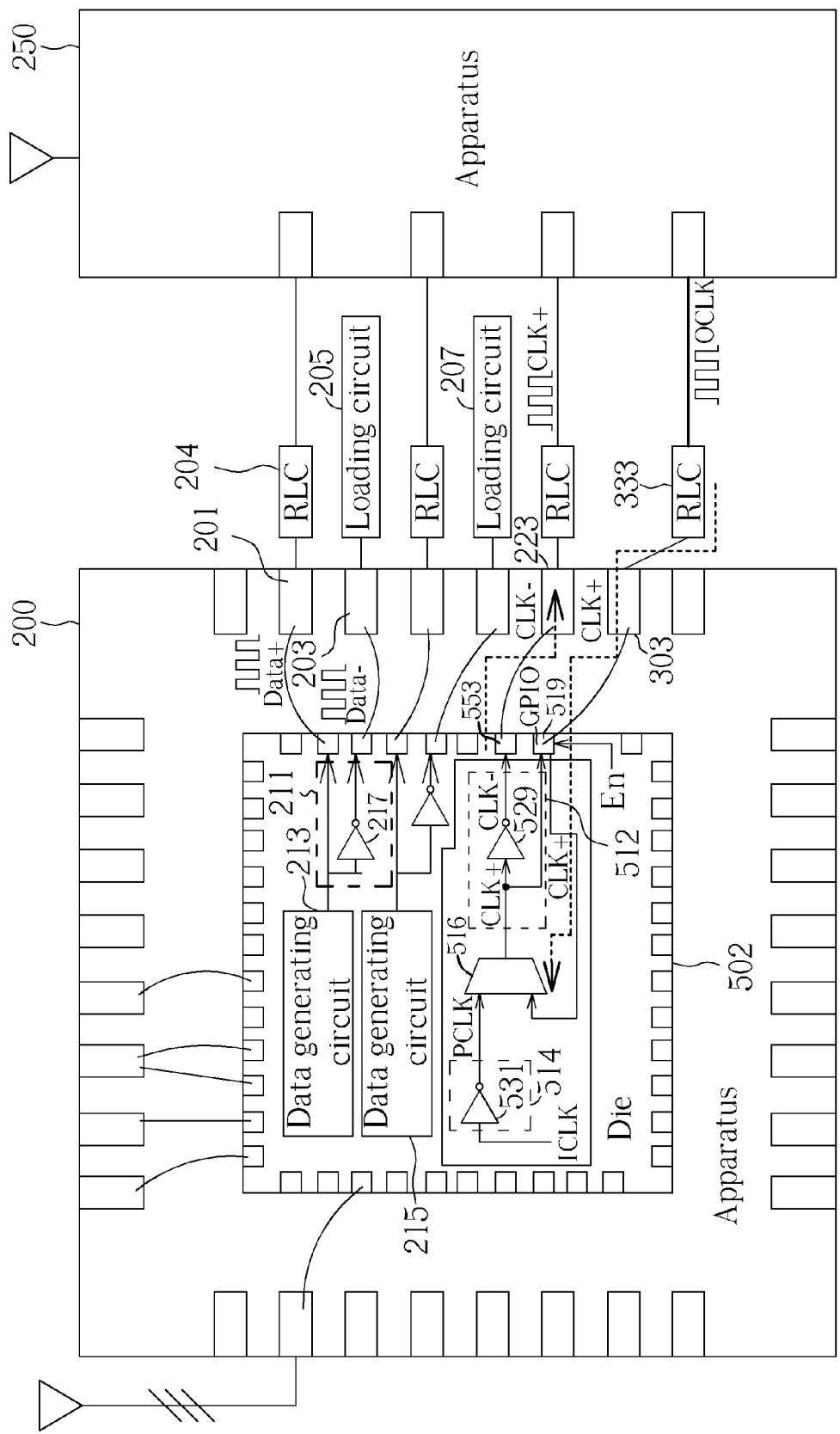
FIG. 5 is a block diagram illustrating an apparatus with EMI protection/reduction mechanism in an external clock mode, according to another embodiment of the present application.

Please refer to FIG. 5. FIG. 5 is a block diagram illustrating an apparatus with EMI protection/reduction mechanism in an external clock mode, according to another embodiment of the present application. In this embodiment, the die 502 includes a clock circuit (not shown), a differential signal generating circuit 512, a phase shifting circuit 514, a multiplexer 516, an output pad 553, and a controllable pad 519. The clock circuit generates an internal clock signal. The phase shifting circuit 514 includes an inverter 531. The inverter 531 receives the internal clock signal ICLK, and inverts the phase of the internal clock signal ICLK so as to generate a phase shifting clock signal PCLK. The multiplexer 516 is able to be controlled by a controller (not shown) for selectively outputting one of an external clock OCLK or the phase shifting clock signal PCLK as a positive clock signal CLK+. The differential signal generating circuit 512 receives the positive clock signal CLK+, and outputs a pair of differential clock signal, including the positive clock signal CLK+, and a negative clock signal CLK−. The phase of the pair of differential clock signal CLK+, CLK− are opposite to each other. The pair of differential clock signal CLK+, CLK− are respectively transmitted to the clock output pads 553, 519. In this embodiment, the differential signal generating circuit 512 includes an inverter 529 for inverting the positive clock signal CLK+ to generate the negative clock signal CLK−.

In this embodiment, by controlling the multiplexer 516 and the controllable pad 519, the apparatus 500 is able to operate in different clock modes, i.e. internal clock mode and external clock mode.

In the internal clock mode, the multiplexer 516 is controlled to output the phase shifting clock signal PCLK as the positive clock signal CLK+. The differential signal generating circuit 512 outputs the negative clock signal CLK− to the clock output pads 553, and outputs the positive clock signal CLK+ to the controllable pad 519. And the controllable pad 519 is controlled to act as an output pad for outputting the positive clock signal CLK+. Alternatively, the differential signal generating circuit 512 includes a delay component (not shown) for delaying the positive clock signal CLK+ so as to compensate the delayed time of the negative clock signal CLK− introduced by the inverter 529. Accordingly, the negative clock signal CLK− has opposite phase with which of the positive clock signal CLK+.

In the external clock mode, the controllable pad 519 is controlled to act as an input pad so as to receive the external clock OCLK. The multiplexer 516 is controlled by the controller to output the external clock signal OCLK rather than to output the phase shifting clock signal PCLK in the internal clock mode. The differential signal generating circuit 512 outputs the negative clock signal CLK− to the clock output pad 553. Thus the negative clock signal CLK− has an opposite phase to which of the external clock signal. In context, the external clock signal OCLK and the negative signal CLK− can be considered as a pair of differential clock signal so as to eliminate or reduce the EMI effect.

Similar with the EMI protection/reduction mechanism of the data signal, the EMI noises introduced by the positive clock signal CLK+ and the negative clock signal CLK− can be neutralized, since they have opposite phases.

Please note that abovementioned embodiments are only for example and do not mean to limit the scope of the present application. For example, the abovementioned chipset is not limited to a well packaged chipset, it can be any apparatus including pads to be coupled and communicated with another device. Also, the above mentioned structure can be configured to transmit any signal. That is, the data signal and the clock signal can be replaced with any desired signal. Furthermore, only part of the above mentioned structures can be included in the apparatus. For example, only data receiving pads or only clock receiving pads are included in the apparatus.

Additionally, the above mentioned structures are not limited to the purpose EMI protection/reduction. These variations under the same concept of above mentioned embodiments should also fall in the scope of the present application.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor chip, comprising:
   an internal clock circuit for generating an internal clock signal;
   a first phase shifting circuit for shifting the phase of an external clock signal and outputting a phase shifting clock signal;
   a multiplexer, coupled to the internal clock circuit and the first phase shifting circuit, for selectively outputting one of the internal clock signal and the phase shifting clock signal to be a first clock signal;
a second phase shifting circuit, coupled to the multiplexer, for shifting the phase of the first clock signal and outputting a second clock signal;
a first output pad, coupled to the multiplexer for outputting the first clock signal; and
a pad, coupled to the first phase shifting circuit and the second phase shifting circuit;
wherein the pad receives the external clock signal and transmits the external clock signal to the first phase shifting circuit, or transmits the second clock signal.

2. The semiconductor chip of claim 1, wherein the first output pad is adjacent to the pad.

3. The semiconductor chip of claim 1, wherein the phase of the first clock signal is opposite to that of the second clock signal.

4. The semiconductor chip of claim 1, wherein the phase of the external clock signal is opposite to that of the phase shifting clock signal.

5. The semiconductor chip of claim 1, further comprising a third output pad adjacent to the pad.

6. A semiconductor chip, comprising:
an internal clock circuit for generating an internal clock signal;
a first phase shifting circuit for shifting the phase of the internal clock signal and outputting a phase shifting clock signal;
a multiplexer, coupled to the first phase shifting circuit, for selectively outputting one of an external clock signal and the phase shifting clock signal to be a first clock signal;
a second phase shifting circuit, coupled to the multiplexer, for shifting the phase of the first clock signal and outputting a second clock signal;
a first output pad, coupled to the second phase shifting circuit for outputting the second clock signal; and
a pad, coupled to the multiplexer;
wherein the pad receives the external clock signal, or transmits the first clock signal.

7. The semiconductor chip of claim 6, wherein the first output pad is adjacent to the pad.

8. The semiconductor chip of claim 6, wherein the phase of the first clock signal is opposite to that of the second clock signal.

9. A method of generating a pair of differential clock signals, wherein the pair of differential clock signals comprises a positive clock signal and a negative clock signal, the method comprising:
providing a first clock signal;
generating a phase shifting clock signal by shifting the phase of a second clock signal;
selectively outputting one of the first clock signal and the phase shifting clock signal to be the positive clock signal;
generating the negative clock signal by shifting the phase of the positive clock signal;
outputting the positive clock signal; and
controlling a controllable pad to selectively act as an input pad for receiving the second clock signal, or act as an output pad for transmitting the negative clock signal.

10. A method of generating a pair of differential clock signals, wherein the pair of differential clock signals comprises a positive clock signal and a negative clock signal, the method comprising:
providing a first clock signal;
generating a phase shifting clock signal by shifting the phase of a second clock signal;
selectively outputting one of the first clock signal and the phase shifting clock signal to be the positive clock signal;
generating the negative clock signal by shifting the phase of the positive clock signal;
outputting the negative clock signal; and
controlling a controllable pad to selectively act as an input pad for receiving the first clock signal, or act as an output pad for transmitting the positive clock signal.

* * * * *